United States Patent [19]
Yu

[11] Patent Number: 5,888,309
[45] Date of Patent: Mar. 30, 1999

[54] LATERAL ETCH INHIBITED MULTIPLE FOR FORMING A VIA THROUGH A MICROELECTRONICS LAYER SUSCEPTIBLE TO ETCHING WITHIN A FLUORINE CONTAINING PLASMA FOLLOWED BY AN OXYGEN CONTAINING PLASMA

[75] Inventor: Chen-Hua Yu, Hsin-chu, Taiwan

[73] Assignee: Taiwan Semiconductor Manufacturing Company, Ltd., Hsin-Chu, Taiwan

[21] Appl. No.: 998,635

[22] Filed: Dec. 29, 1997

[51] Int. Cl.⁶ .............................. B08B 6/00; H01L 21/302
[52] U.S. Cl. ........................... 134/1.2; 134/1.3; 438/704; 438/723; 438/718; 438/725; 438/734
[58] Field of Search ..................... 134/1.2, 1.3; 438/704, 438/723, 718, 725, 734

[56] References Cited

U.S. PATENT DOCUMENTS

| | | | |
|---|---|---|---|
| 4,410,622 | 10/1983 | Dalal et al. | 430/312 |
| 5,496,438 | 3/1996 | Wootton et al. | 156/643.1 |
| 5,632,855 | 5/1997 | Jones et al. | 437/714 |
| 5,643,407 | 7/1997 | Chang | 156/644.1 |
| 5,661,083 | 8/1997 | Chen et al. | 438/637 |

FOREIGN PATENT DOCUMENTS 5-102108  4/1993  Japan .

OTHER PUBLICATIONS

"Characterization of Functional Probe Failure of 0.8 Micron CMOS Devices"; Wu et. al.; Proc.–Elect. Soc. (1994), 94–20 pp. 410–420.

"Integration of Low K Organic Flowable SOG in a Non–Etchback/CMP Process"; Chen et. al.; S.P.I.E., vol. 3214, pp. 86–93, Oct. 1997.

"Application of Microwave Downstream Plasma For Cleaning: Post Via—Etch Residue Removal"; Deshmukh et. al.; 1996; Proc.–Electrochem. Soc. (1996); abstract only.

*Primary Examiner*—William Powell
*Assistant Examiner*—George Goudreau
*Attorney, Agent, or Firm*—George O. Saile; Stephen B. Ackerman; Alek P. Szecsy

[57] ABSTRACT

A method for forming within a microelectronics fabrication a via through a microelectronics layer formed of a material susceptible to sequential etching employing a fluorine containing plasma etch method followed by an oxygen containing plasma etch method. There is first provided a substrate employed within a microelectronics fabrication. There is then formed over the substrate a microelectronics layer formed of a material susceptible to sequential etching employing a fluorine containing plasma etch method followed by an oxygen containing plasma etch method. There is then formed upon the microelectronics layer a patterned photoresist layer. There is then etched through use of the fluorine containing plasma etch method while employing the patterned photoresist layer as a photoresist etch mask layer the microelectronics layer to form a patterned microelectronics layer having a via formed through the patterned microelectronics layer. The fluorine containing plasma etch method employing a fluorine containing etchant gas composition which simultaneously forms a fluorocarbon polymer residue layer upon a sidewall of the via. There is then stripped through use of the oxygen containing plasma etch method the patterned photoresist layer from the patterned microelectronics layer while leaving remaining a no greater than partially etched fluorocarbon polymer residue layer upon the sidewall of the via. Finally, there is then stripped through use of a wet chemical stripping method the no greater than partially etched fluorocarbon polymer residue layer from the sidewall of the via.

17 Claims, 5 Drawing Sheets

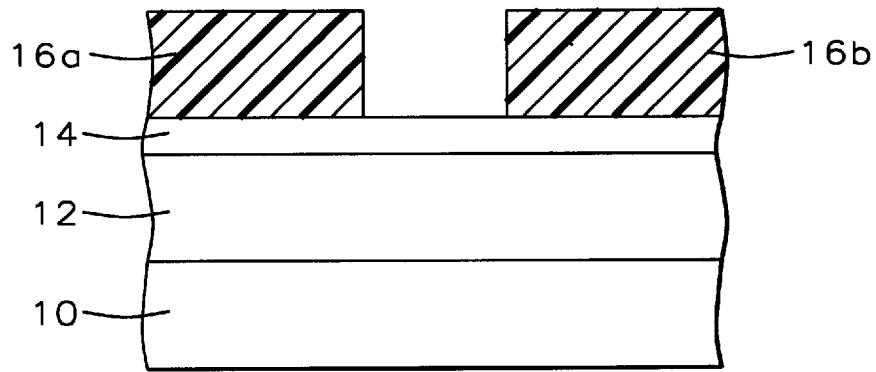
FIG. 1 – Prior Art
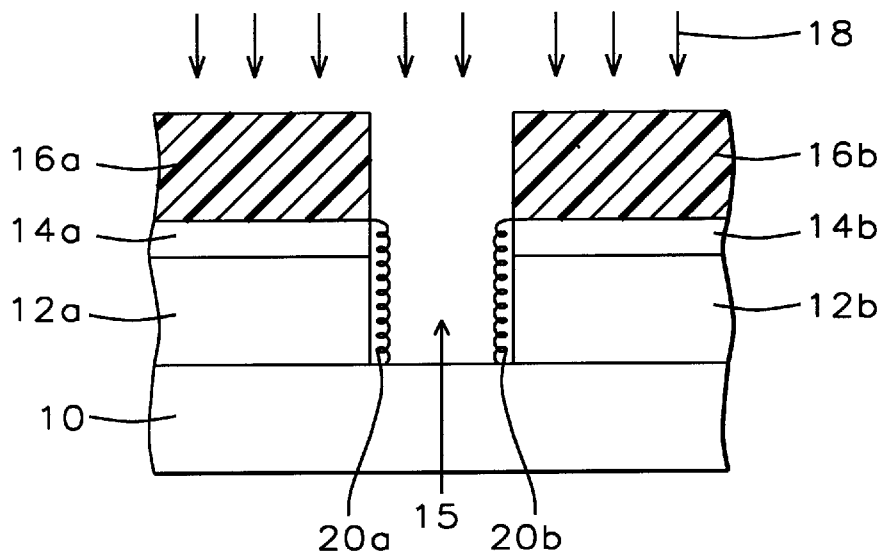
FIG. 2 – Prior Art
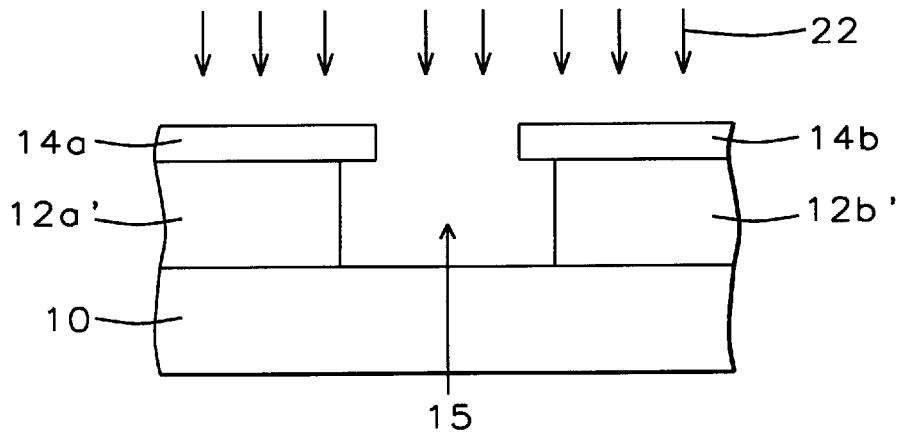
FIG. 3 – Prior Art

LATERAL ETCH INHIBITED MULTIPLE FOR FORMING A VIA THROUGH A MICROELECTRONICS LAYER SUSCEPTIBLE TO ETCHING WITHIN A FLUORINE CONTAINING PLASMA FOLLOWED BY AN OXYGEN CONTAINING PLASMA

BACKGROUND OF THE INVENTION

1. Field of the Invention

The present invention relates generally to microelectronics layers susceptible to etching within fluorine containing plasmas followed by oxygen containing plasmas. More particularly, the present invention relates to methods for forming vias through microelectronics layers susceptible to etching within fluorine containing plasmas followed by oxygen containing plasmas.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and conductor element dimensions have decreased, it has become more common within the art of microelectronics fabrication to form interposed between the patterns of patterned microelectronics conductor layers low dielectric constant microelectronics dielectric layers. Low dielectric constant microelectronics dielectric layers within microelectronics fabrications are typically formed from carbon and/or hydrogen containing low dielectric constant dielectric materials such as but not limited to amorphous carbon dielectric materials, silsesquioxane spin-on-glass (SOG) dielectric materials and organic polymer spin-on-polymer dielectric materials. Particularly prevalent in the art of microelectronics fabrication are low dielectric constant dielectric layers formed from silsesquioxane spin-on-glass (SOG) dielectric materials.

Silsesquioxane spin-on-glass (SOG) dielectric materials are characterized by the general chemical formula R1-Si(OR2)3, where:(1) R1 may be any of several radicals, including but not limited to hydrogen radical and carbon bonded organic radicals, but not oxygen bonded radicals; and (2) R2 is typically, although not exclusively, a carbon bonded organic radical such as but not limited to methyl radical (—CH3) or ethyl radical (—C2H5). Low dielectric constant layers are typically formed from silsesquioxane spin-on-glass (SOG) dielectric materials through chemically and/or thermally induced condensation reactions which modify and cross-link the silicon-OR2 bonds of a silsesquioxane spin-on-glass (SOG) dielectric material, while typically leaving the silicon-R1 bond intact.

Low dielectric constant dielectric layers formed from low dielectric constant dielectric materials such as but not limited to amorphous carbon dielectric materials, silsesquioxane spin-on-glass (SOG) dielectric materials and organic polymer spin-on-polymer Dielectric materials are desirable interposed between the patterns of patterned microelectronics conductor layers within microelectronics fabrications since there is thus typically efficiently and manufacturably formed a microelectronics fabrication with an enhanced microelectronics fabrication speed, a decreased patterned microelectronics conductor layer parasitic capacitance and a decreased patterned microelectronics conductor layer crosstalk.

While low dielectric constant dielectric layers formed within microelectronics fabrications from low dielectric constant dielectric materials such as but not limited to amorphous carbon dielectric materials, silsesquioxane spin-on-glass (SOG) dielectric materials and organic polymer spin-on-polymer dielectric materials are thus desirable within the art of microelectronics fabrication, low dielectric constant dielectric layers are not formed entirely without problems within microelectronics fabrications.

In particular, it is known in the art of microelectronics fabrication that when attempting to form through a low dielectric constant dielectric layer formed from an amorphous carbon dielectric material or a silsesquioxane spin-on-glass (SOG) dielectric material a via while employing a conventional fluorine containing high density plasma (HDP) plasma etch method (ie: a plasma etch method having a plasma density of greater than about 1E11 per square centimeter) employing an etchant gas composition comprising a fluorine containing etchant gas, such as but not limited to a fluorocarbon etchant gas, there is typically observed a substantially attenuated etch rate of the low dielectric constant dielectric layer. In contrast, although enhanced etch rates of low dielectric constant dielectric layers formed from fluorine containing plasma etchable low dielectric constant dielectric materials such as but not limited to amorphous carbon dielectric materials and silsesquioxane spin-on-glass (SOG) dielectric materials may be obtained when employing within microelectronics fabrications enhanced anisotropic etch methods, such as but not limited to magnetically enhanced reactive ion etch (MERLE) anisotropic etch methods, which also employ etchant gas compositions comprising fluorine containing etchant gases (such as fluorocarbon etchant gases), such enhanced anisotropic etch methods typically form upon the sidewall of a via formed through the low dielectric constant dielectric layer a fluorocarbon polymer residue layer. The fluorocarbon polymer residue layer when subsequently simultaneously stripped through a higher pressure (ie: reactor chamber pressure of from about 0.10 to about 10 torr) isotropic oxygen plasma etch method along with a patterned photoresist layer employed in defining the via typically laterally etches the low dielectric constant dielectric layer exposed within the via to form a laterally etched via. A series of schematic cross-sectional diagrams illustrating the results of progressive process stages in forming such a laterally etched via within such a low dielectric constant dielectric layer which in part defines the laterally etched via is shown within the schematic cross-sectional diagrams of FIG. 1 to FIG. 3.

Shown in FIG. 1 is a substrate 10 employed within a microelectronics fabrication, where the substrate 10 has formed thereupon a blanket low dielectric constant dielectric layer 12 which may be formed from a low dielectric constant dielectric material including but not limited to an amorphous carbon dielectric material or a silsesquioxane spin-on-glass (SOG) dielectric material. There is in turn formed upon the blanket low dielectric constant dielectric layer 12 a blanket silicon containing dielectric layer 14 which is typically formed of a silicon containing dielectric material such as but not limited to a silicon oxide dielectric material, a silicon nitride dielectric material or a silicon oxynitride dielectric material. Finally, there is formed upon the blanket silicon containing dielectric layer 14 a pair of patterned photoresist layers 16a and 16b.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is schematic cross-sectional diagram of a microelectronics fabrication otherwise equivalent to the microelectronics fabrication whose schematic cross-sectional diagram is illustrated in FIG. 1, but wherein the blanket silicon containing dielectric layer 14 and the blanket low dielectric constant dielectric layer 12 have been sequentially patterned through use of a fluorine containing etching plasma 18, while employing the patterned photoresist layers 16a and 16b as an etch mask, to form: (1) the corresponding patterned silicon containing dielectric layers 14a and 14b; and (2) the corresponding patterned low dielectric constant dielectric layers 12a and 12b, which in the aggregate define a via 15 accessing the substrate 10. Upon the sidewalls of the via 15 there is formed a pair of fluorocarbon polymer residue layers 20a and 20b.

The fluorocarbon polymer residue layers 20a and 20b typically derive fluorine and carbon from a fluorocarbon etchant gas composition employed within the fluorine containing etching plasma 18, if a fluorocarbon etchant gas composition is employed, or in the alternative from fluorine within the fluorine containing etchant gas composition along with carbon which may be obtained from etching of a carbon containing blanket low dielectric constant dielectric layer 12 or through slight etching of the patterned photoresist layers 16a and 16b.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication in-part otherwise equivalent to the microelectronics fabrication whose schematic cross-sectional diagram is illustrated in FIG. 2, but wherein the patterned photoresist layers 16a and 16b, and the fluorocarbon polymer residue layers 20a and 20b, have been stripped from the microelectronics fabrication through use of an oxygen containing etching plasma 22 typically employing conventional oxygen containing plasma etching conditions including a reactor chamber pressure of from about 0.10 to about 10 torr. In the process of stripping from the microelectronics fabrication whose schematic cross-sectional diagram is illustrated in FIG. 2 the patterned photoresist layers 16a and 16b and the fluorocarbon polymer residue layers 20a and 20b to form the microelectronics fabrication whose schematic cross-sectional diagram is illustrated in FIG. 3, there is simultaneously typically also laterally (ie: isotropically) etched the patterned low dielectric constant dielectric layers 12a and 12b exposed within the via 15 sidewalls to form the laterally etched low dielectric constant dielectric layers 12a' and 12b' as illustrated in FIG. 3, which in conjunction with the patterned silicon containing dielectric layers 14a and 14b define a laterally etched via 15'.

Microelectronics fabrications analogous or equivalent to the microelectronics fabrication whose schematic cross-sectional diagram is illustrated in FIG. 3 are undesirable within the art of microelectronics fabrication since it is often difficult to subsequently form void free microelectronics layers, such as but not limited to void free patterned microelectronics conductor stud layers, within undercut (ie: re-entrant) vias such as the laterally etched via 15'. It is thus towards the goal of forming within microelectronics fabrications while employing fluorine containing plasma etch methods vias through low dielectric constant dielectric layers formed of dielectric materials which are susceptible to sequential etching employing fluorine containing plasma etch methods followed by oxygen containing plasma etch methods, such dielectric materials including but not limited to amorphous carbon dielectric materials and silsesquioxane spin-on-glass (SOG) dielectric materials, while avoiding laterally etching those vias when stripping from those microelectronics fabrications through oxygen containing plasma etch methods: (1) patterned photoresist layers employed in defining those vias; and (2)fluorocarbon polymer residue layers formed upon those via sidewalls incident to the fluorine containing plasma etch methods, that the present invention is more specifically directed.

In a more general sense, the present invention is also directed towards providing a method for forming a residue free via through a microelectronics layer formed from a material which is susceptible to sequential etching employing a fluorine containing plasma etch method followed by an oxygen containing plasma etch method, without laterally etching the via. Such materials include, but are not limited to, carbon materials (including but not limited to amorphous carbon materials, graphite materials and diamond materials), sulfur materials (including but not limited to amorphous sulfur materials and crystalline sulfur materials), silsesquioxane spin-on-glass (SOG) materials (as defined above) and incompletely cured silicate spin-on-glass (SOG) dielectric materials.

Various novel plasma etch methods and materials have been disclosed in the art of microelectronics fabrication.

For example, Wootton et al., in U.S. Pat. No. 5,496,438 discloses a method for removing from a patterned metal layer formed through a plasma etch method employing a corrosive plasma etchant gas composition a patterned photoresist etch mask layer employed in defining the patterned metal layer. Through the method there is etched the patterned photoresist etch mask layer in an oxygen gas plasma for a sufficiently long time and at a sufficiently high temperature (but beneath a melting temperature of the patterned metal layer) to remove all residual corrosive gas absorbed within the patterned photoresist layer, thus forming the patterned metal layer without staining.

In addition, Jones et al., in U.S. Pat. No. 5,632,855, discloses a plasma etch method for etching a thermal oxide layer within an integrated circuit microelectronics fabrication. The method employs various plasma etchant gas compositions comprising various concentrations of argon, carbon tetrafluoride and trifluoromethane employed within various sequential process steps including etch pre-stabilizing process steps, etch process steps, etch post-stabilizing process steps and particle flush process steps, to provide a plasma etched thermal oxide layer of enhanced thickness uniformity across a semiconductor substrate, including contact regions of the semiconductor substrate.

Finally, Chang, in U.S. Pat. No. 5,643,407, discloses a method for forming vias through sandwich composite spin-on-glass (SOG) dielectric layers within integrated circuit microelectronic fabrications. The method employs a nitrogen plasma treatment of exposed portions of the spin-on-glass (SOG) dielectric layers within the vias to provide vias with attenuated susceptibility to moisture absorption and outgassing which corrodes patterned conductor metal layers subsequently formed within those vias.

Desirable in the art of microelectronics fabrication are methods through which there may be formed residue free vias through microelectronics layers formed of materials susceptible to sequential etching employing fluorine containing plasma etch methods followed by oxygen containing plasma etch methods, without laterally etching the vias. More particularly desirable in the art of microelectronics fabrication are fluorine containing plasma etch methods through which there may be formed residue free vias through low dielectric constant dielectric layers formed of low dielectric constant dielectric materials which are susceptible to sequential etching employing fluorine containing plasma etch methods followed by oxygen containing plasma etch methods, such materials including but not limited to amorphous carbon dielectric materials and silsesquioxane spin-on-glass (SOG) dielectric materials, without laterally etching the vias when stripping from the microelectronics fabrications through the oxygen containing plasma etch methods patterned photoresist layers employed in defining the vias and fluorocarbon polymer residue layers which are formed upon the via sidewalls incident to the fluorine containing plasma etch methods. It is towards these goals that the present invention is both generally and more specifically directed.

SUMMARY OF THE INVENTION

A first object of the present invention is to provide a method for forming a via through a microelectronics layer formed from a material which is susceptible to sequential etching employing a fluorine containing plasma etch method followed by an oxygen containing plasma etch method.

A second object of the present invention is to provide a method in accord with the first object of the present invention, where the via is formed without laterally etching the via.

A third object of the present invention is to provide a method in accord with the first object of the present invention or the second object of the present invention, where the microelectronics fabrication is an integrated circuit microelectronics fabrication A fourth object of the present invention is to provide a method in accord with the first object of the present invention, the second object of the present invention or the third object of the present invention, where the microelectronics layer is a low dielectric constant dielectric layer formed from an amorphous carbon material or a silsesquioxane spin-on-glass (SOG) material.

A fifth object of the present invention is to provide a method in accord with the first object of the present invention, the second object of the present invention, the third object of the present invention or the fourth object of the present invention, which method is readily commercially implemented.

In accord with the objects of the present invention, there is provided by the present invention a method for forming a via through a microelectronics layer formed of a material susceptible to sequential etching employing a fluorine containing plasma etch method followed by an oxygen containing plasma etch method, without laterally etching the via. To practice the method of the present invention, there is first provided a substrate employed within a microelectronics fabrication. There is then formed over the substrate a microelectronics layer susceptible to sequential etching employing a fluorine containing plasma etch method followed by an oxygen containing plasma etch method. There is then formed over the microelectronics layer a patterned photoresist layer. There is then etched through use of the fluorine containing plasma etch method while employing the patterned photoresist layer as an etch mask layer the microelectronics layer to form a patterned microelectronics layer having a via formed through the patterned microelectronics layer. The fluorine containing plasma etch method employs a fluorine containing etchant gas composition which simultaneously forms a fluorocarbon polymer residue layer upon a sidewall of the via. There is then stripped through use of the oxygen containing plasma etch method the patterned photoresist layer from the patterned microelectronics layer while leaving remaining a no greater than partially etched fluorocarbon polymer residue layer upon the sidewall of the via. Finally, there is then stripped through use of a wet chemical stripping method the no greater than partially etched fluorocarbon polymer residue layer from the sidewall of the via.

The present invention provides a method for forming a via through a microelectronics layer formed of a material which is susceptible to sequential etching employing a fluorine containing plasma etch method followed by an oxygen containing plasma etch method, without laterally etching the via. The method of the present invention realizes the foregoing objects by employing the fluorine containing plasma etch method for forming, while employing a patterned photoresist layer as a photoresist etch mask layer, a patterned microelectronics layer having a via formed therethrough, where the via has a fluorocarbon polymer residue layer formed upon a sidewall of the via. The method then employs the oxygen containing plasma etch method for stripping from the patterned microelectronics layer so formed the photoresist etch mask layer while no greater than partially etching the fluorocarbon polymer residue layer to form a no greater than partially etched fluorocarbon polymer residue layer. The no greater than partially etched fluorocarbon polymer residue layer is then completely stripped from the sidewall of the via while employing a wet chemical stripping method.

The method of the present invention may be employed where the microelectronics fabrication is an integrated circuit microelectronics fabrication and where the microelectronics layer is a low dielectric constant dielectric layer formed from an amorphous carbon dielectric material or a silsesquioxane spin-on-glass (SOG) dielectric material. The method of the present invention does not discriminate with respect to the nature of a microelectronics fabrication within which may be formed through a microelectronics layer formed of a material susceptible to sequential etching within a fluorine containing plasma etch method followed by an oxygen containing plasma etch method a via through the method of the present invention. Thus, the method of the present invention may be employed in forming through microelectronics layers formed of materials susceptible to sequential etching within fluorine containing plasma etch methods followed by oxygen containing plasma etch methods vias within microelectronics fabrications including but not limited to integrated circuit microelectronics fabrications, solar cell microelectronics fabrications, ceramic substrate microelectronics fabrications and flat panel display microelectronics fabrications. Similarly, the method of the present invention does not discriminate with respect to the nature of a microelectronics layer through which may be formed a via through the method of the present invention, provided the microelectronics layer is formed from a material susceptible to sequential etching employing a fluorine containing plasma etch method followed by an oxygen containing plasma etch method. Thus, the method of the present invention may be employed in forming vias through microelectronics layers formed from materials including but not limited to carbon materials (including but not limited to amorphous carbon materials, graphite materials and diamond materials), sulfur materials (including but not limited to amorphous sulfur materials and crystalline sulfur materials), silsesquioxane spin-on-glass (SOG) dielectric materials (as defined above) and incompletely cured silicate spin-on-glass (SOG) dielectric materials (as defined below), independent of the dielectric characteristics of the material.

The method of the present invention is readily commercially implemented. The method of the present invention employs a fluorine containing plasma etch method, an oxygen containing plasma etch method and a wet chemical stripping method for forming a via through a microelectronics layer formed of a material susceptible to sequential etching within a fluorine containing plasma etch method followed by an oxygen containing plasma etch method. Since it is at least in part the process control within the method of the present invention which provides novelty within the method of the present invention, rather than the existence of the component etch methods which provides the method of the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 to FIG. 3 show a series of schematic cross-sectional diagrams illustrating the resulting of forming within a microelectronics fabrication a laterally etched via through a low dielectric constant dielectric layer in accord with a method conventional in the art of microelectronics fabrication.

DESCRIPTION OF THE PREFERRED EMBODIMENTS

The present invention provides a method for forming within a microelectronics fabrication a via through a microelectronics layer formed from a material which is susceptible to sequential etching employing a fluorine containing plasma etch method followed by an oxygen containing plasma etch method, without laterally etching the via. The method of the present invention realizes the foregoing objects by employing the fluorine containing plasma etch method for forming, while employing a patterned photoresist layer as a photoresist etch mask layer, a via through the microelectronics layer to form a patterned microelectronics layer while simultaneously forming a fluorocarbon polymer residue layer upon a sidewall of the via. The method then employs the oxygen containing plasma etch method for stripping from the patterned microelectronics layer so formed the patterned photoresist layer while forming a no greater than partially etched fluorocarbon polymer residue layer from the fluorocarbon polymer residue layer. The no greater than partially etched fluorocarbon polymer residue layer is then completely stripped from the sidewall of the via while employing a wet chemical stripping method.

Although the method of the present invention has particular value when forming within an integrated circuit microelectronics fabrication an interconnection via through a low dielectric constant dielectric layer to access a patterned conductor layer within the integrated circuit microelectronic fabrication, the method of the present invention may more generally be employed in forming a via through any microelectronics layer formed of a material which is susceptible to sequential etching employing a fluorine containing plasma etch method followed by an oxygen containing plasma etch method. Such materials include, but are not limited to carbon materials (including but not limited to amorphous carbon materials, graphite materials and diamond materials), sulfur materials (including but not limited to amorphous sulfur materials and crystalline sulfur materials), silsesquioxane spin-on-glass (SOG) materials (as defined above) and incompletely cured silicate spin-on-glass (SOG) materials (as defined below). Similarly, the method of the present invention may be employed in forming vias through microelectronics layers formed from materials susceptible to sequential etching within fluorine containing plasma etch methods followed by oxygen containing plasma etch methods within microelectronics fabrications including but not limited to integrated circuit microelectronics fabrications, solar cell microelectronics fabrications, ceramic substrate microelectronics fabrications and flat panel display microelectronics fabrications.

First Preferred Embodiment

Figure 4:
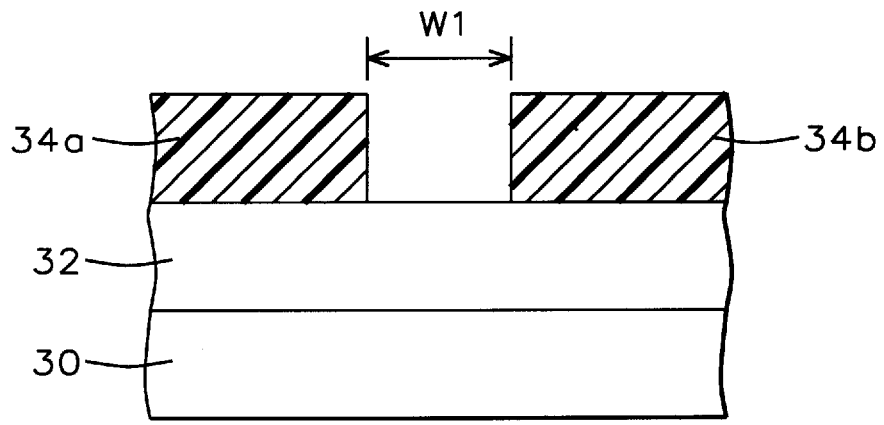
FIG. 4 to FIG. 7 show a series of schematic cross-sectional diagrams illustrating the results of forming within a microelectronics fabrication in accord with a general preferred embodiment of the present invention which comprises a first preferred embodiment of the present invention a via through a microelectronics layer formed of a material which is susceptible to sequential etching employing a fluorine containing plasma etch method followed by an oxygen containing plasma etch method, without laterally etching the via.

Referring now to FIG. 4 to FIG. 7, there is shown a series of schematic cross-sectional diagrams illustrating the results of forming within a microelectronics fabrication in accord with a general preferred embodiment of the present invention which comprises a first preferred embodiment of the present invention a via through a microelectronics layer formed of a material susceptible to sequential etching employing a fluorine containing plasma etch method followed by an oxygen containing plasma etch method, without laterally etching the via. Shown in FIG. 4 is a schematic cross-sectional diagram of the microelectronics fabrication at an early stage in its fabrication.

Shown in FIG. 4 is a substrate 30 employed within a microelectronics fabrication, where the substrate 30 has formed thereupon a blanket microelectronics layer 32. In turn, the blanket microelectronics layer 32 has formed thereupon a pair of patterned photoresist layers 34a and 34b.

Within the first preferred embodiment of the present invention as illustrated in FIG. 4, the substrate 30 may be employed in forming a microelectronics fabrication including but not limited to an integrated circuit microelectronics fabrication, a solar cell microelectronics fabrication, a ceramic substrate microelectronics fabrication and a flat panel display microelectronics fabrication. Although not specifically illustrated within the schematic cross-sectional diagram of FIG. 4, the substrate 30 may be a substrate by itself employed within the microelectronics fabrication, or the substrate 30 may alternatively be the substrate employed within the microelectronics fabrication, where the substrate has formed thereupon and/or thereover any of several additional microelectronics layers as are conventionally employed within the microelectronics fabrication. Such additional microelectronics layers may include, but are not limited to, microelectronics conductor layers, microelectronics semiconductor layers and microelectronics dielectric layers.

With respect to the blanket microelectronics layer 32, within the first preferred embodiment of the present invention the blanket microelectronics layer 32 is formed from a material which is susceptible to sequential etching employing a fluorine containing plasma etch method followed by an oxygen containing plasma etch method. Such materials include, but are not limited to, carbon materials (including but not limited to amorphous carbon materials, graphite materials and diamond materials), sulfur materials (including but not limited to amorphous sulfur materials and crystalline sulfur materials), at least partially cured silsesquioxane spin-on-glass (SOG) dielectric materials, and incompletely cured silicate spin-on-glass (SOG) dielectric materials. Preferably, the microelectronics layer 32 so formed is formed to a thickness of from about 1000 to about 10000 angstroms.

Within the present invention, silsesquioxane spin-on-glass (SOG) dielectric materials are, as discussed within the Description of the Related Art, characterized by the general chemical formula R1-Si(OR2)3, where: (1) R1 may be any of several radicals, including but not limited to hydrogen radical and carbon bonded organic radicals, but not oxygen bonded radicals; and (2) R2 is typically, although not exclusively, a carbon bonded organic radical such as but not limited to methyl radical (—CH3) and ethyl radical (—C2H5). Thus, within the first preferred embodiment of the present invention when the blanket microelectronics layer 32 is formed from a silsesquioxane spin-on-glass (SOG) dielectric material, the blanket microelectronics layer 32 is preferably formed from a silsesquioxane spin-on-glass (SOG) dielectric material chosen from the group of silsesquioxane spin-on-glass (SOG) dielectric materials including but not limited to: (1) hydrogen silsesquioxane spin-on-glass (SOG) dielectric materials (H-Si(OR)3); (2) carbon bonded organo functional silsesquioxane spin-on-glass (SOG) dielectric materials such as but not limited to methyl silsesquioxane spin-on-glass (SOG) dielectric materials (CH3-Si(OR)3), ethyl silsesquioxane spin-on-glass (SOG) dielectric materials (C2H5-Si(OR)3) and other organo functional silsesquioxane spin-on-glass (SOG) dielectric materials; and (3) fluorocarbon functional silsesquioxane spin-on-glass (SOG) dielectric materials such as but not limited to perfluoromethyl silsesquioxane spin-on-glass (SOG) dielectric materials (CF3-Si(OR)3) and perfluoroethyl silsesquioxane spin-on-glass (SOG) dielectric materials (C2F5-Si(OR)3), where R typically equals a carbon bonded organic radical, such as but not limited to a methyl radical (—CH3) or an ethyl radical (—C2H5). Similarly, within the method of the present invention, silicate spin-on-glass (SOG) dielectric materials are intended as materials where a central silicon atom is bonded only to oxygen atoms. Such materials include, but not limited to, silicic acid (ie: H2SiO3) derivatives and ortho silicate derivatives including but not limited to tetra ethyl ortho silicate (ie: Si (OC2H5)4; TEOS) derivatives. Curing of these materials proceeds through methods similar to those employed with silsesquioxane spin-on-glass (SOG) materials, but typically with a greater density of cross-linking.

With respect to the patterned photoresist layers 34a and 34b, within the first preferred embodiment of the present invention the patterned photoresist layers 34a and 34b may be formed from any of several photoresist materials as are conventionally employed in the art of microelectronics fabrication, including photoresist materials chosen from the general groups of photoresist materials including but not limited to positive photoresist materials and negative photoresist materials. Preferably, the patterned photoresist layers 34a and 34b so formed are each formed to a thickness of from about 5000 to about 15000 angstroms upon the blanket microelectronics layer 32 to define an aperture of width W1, as illustrated in FIG. 4, of from about 1000 to about 10000 angstroms leaving exposed the blanket microelectronics layer 32.

Figure 5:
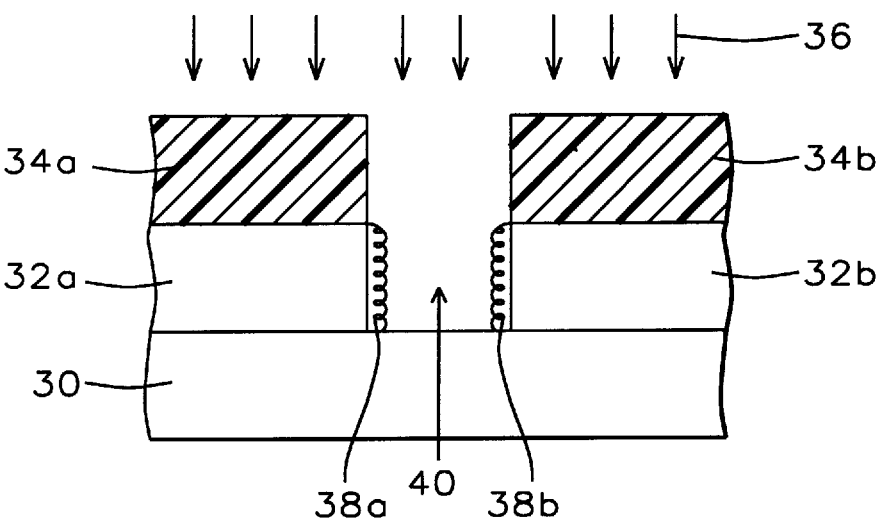

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket microelectronics layer 32 has been patterned to form a pair of patterned microelectronics layers 32a and 32b through use of a fluorine containing etching plasma 36, while employing the patterned photoresist layers 34a and 34b as an etch mask layer. The pair of patterned microelectronics layers 32a and 32b so formed defines a via 40. Incident to forming the patterned microelectronics layers 32a and 32b from the blanket microelectronics layer 32, there is formed upon the via 40 sidewalls a pair of fluorocarbon polymer residue layers 38a and 38b.

Within the first preferred embodiment of the present invention, the fluorine containing etching plasma 36 is preferably a magnetically enhanced reactive ion etch (MERIE) anisotropic fluorine containing etching plasma which employs an etchant gas composition employing a fluorine containing etchant gas chosen from the group of fluorine containing etchant gases including but not limited to perfluorocarbons (preferably of no greater than three carbon atoms), hydrofluorocarbons (preferably of no greater than three carbon atoms), sulfur hexafluoride and nitrogen trifluoride. The fluorocarbon polymer residue layers 38a and 38b formed through action of the fluorine containing etching plasma 36 typically derive from perfluorocarbon or hydrofluorocarbon etchant gases employed within the fluorine containing etching plasma 36, if such perfluorocarbon or hydrofluorocarbon etchant gases are employed therein. In the alternative, the fluorocarbon polymer residue layers 38a and 38b may also derive from fluorine species within the fluorine containing etching plasma 36, along with carbon derived from slight etching of the patterned photoresist layers 34a and 34b or from etching of the blanket microelectronics layer 32 when the blanket microelectronics layer contains carbon.

Preferably, the fluorine containing etching plasma 36 also employs: (1) a reactor chamber pressure of from about 0.1 to about 10 torr; (2) a radio frequency plasma power of from about 100 to about 5000 watts at a radio frequency of 13.56 MHZ; (3) a substrate 30 temperature of from about −20 to about 280 degrees centigrade; (4) a magnetic field strength of from about 10 to about 200 gauss; and (5) and a fluorine containing plasma etchant gas flow rate of from about 5 to about 100 standard cubic centimeters per minute (sccm), for a time period sufficient to completely etch through the blanket microelectronics layer 32 and fully expose the substrate 30.

Figure 6:
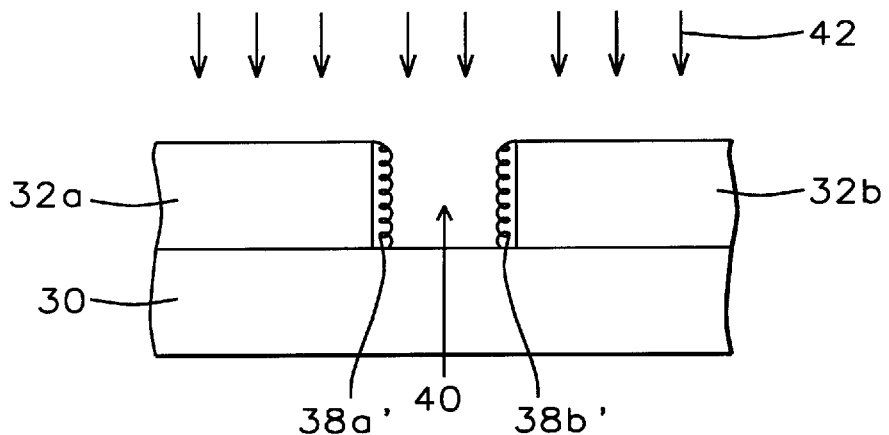

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram of FIG. 5, but wherein the patterned photoresist layers 34a and 34b have been stripped from the microelectronics fabrication through use of an oxygen containing etching plasma 42. As is illustrated within the schematic cross-sectional diagram of FIG. 6, the oxygen containing etching plasma 42 is employed primarily in stripping completely from the microelectronics fabrication whose schematic cross-sectional diagram is illustrated in FIG. 5 the patterned photoresist layers 34a and 34b to form the microelectronics fabrication whose schematic cross-sectional diagram is illustrated in FIG. 6. As is thus also illustrated within the schematic cross-sectional diagram of FIG. 6, the fluorocarbon polymer residue layers 38a and 38b as illustrated in FIG. 5 are no greater than partially etched within the oxygen containing etching plasma 42 in forming the no greater than partially etched fluorocarbon polymer residue layers 38a' and 38b'. Within the first preferred embodiment of the present invention, the no greater than partially etched fluorocarbon polymer residue layers 38a' and 38b' impede lateral etching of the patterned microelectronics layers 32a and 32b which define the via 40.

Within the first preferred embodiment of the present invention, the oxygen containing etching plasma 42 may employ an oxygen containing etching gas chosen from the group of oxygen containing etching gases including but not limited to oxygen, ozone, nitrous oxide and nitric oxide. More preferably, the oxygen containing etching plasma 42 employs oxygen. Within the first preferred embodiment of the present invention, it has been found experimentally that the oxygen containing etching plasma 42 is preferably employed at a reactor chamber pressure of from about 1 to about 100 mtorr (more preferably from about 1 to about 50 mtorr and most preferably from about 1 to about 10 mtorr) which is substantially less than a reactor chamber pressure of from about 0.10 to about 10 torr at which oxygen containing etching plasmas otherwise are typically employed when stripping patterned photoresist layers from patterned substrate layers within microelectronics fabrications. Under such circumstances, the oxygen containing etching plasma 42 exhibits attenuated isotropic characteristics and the fluorocarbon polymer residue layers 38a and 38b as illustrated within the schematic cross-sectional diagram of FIG. 5 are incompletely stripped in forming the no greater than partially etched fluorocarbon polymer residue layers 38a' and 38b' within the schematic cross-sectional diagram of FIG. 6.

Preferably, the oxygen containing etching plasma 42 also employs: (1) a radio frequency plasma power of from about 500 to about 8000 watts at a radio frequency of from about 2E6 to about 2.45E9 Hz; (2) a substrate 30 temperature of from about −20 to about 300 degrees centigrade; and (3) an oxygen containing etching gas flow rate of from about 5 to about 100 standard cubic centimeters per minute (sccm).

Figure 7:
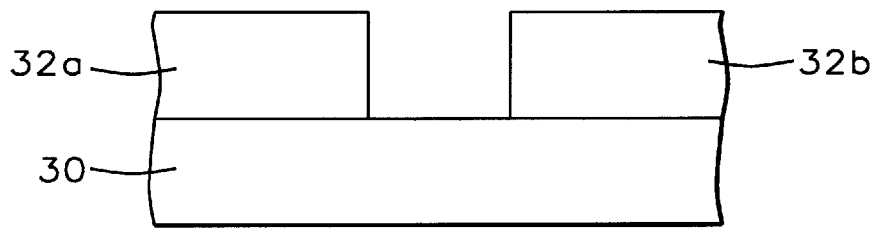

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein the no greater than partially etched fluorocarbon polymer residue layers 38a' and 38b' have been stripped from the microelectronics fabrication. The no greater than partially etched fluorocarbon polymer residue layers 38a' and 38b' are stripped from the microelectronics fabrication whose schematic cross-sectional diagram is illustrated in FIG. 6 to provide the microelectronics fabrication whose schematic cross-sectional diagram is illustrated in FIG. 7 through use of a wet chemical stripping method employing a wet chemical stripper solvent or solution which does not appreciably etch the patterned microelectronics layers 32a and 32b. Such wet chemical stripper solvents or solutions may include, but are not limited to, organic solvents, such as but not limited acetone, N-methylpyrrolidone, tetrahydrofuran and ethanolamine, as well as aqueous solutions thereof. Aqueous ethanolamine wet chemical stripper solutions are particularly preferred within the first preferred embodiment of the present invention when employed at from about 1 to about 99 weight percent ethanolamine at a wet chemical stripper solution temperature of from about 24 to about 120 degrees centigrade for a for a wet chemical stripping time period of from about 1 to about 30 minutes. Pure ethanolamine solvent may also be employed under equivalent exposure conditions.

Upon forming the microelectronics fabrication whose schematic cross-sectional diagram is illustrated in FIG. 7, there is formed a microelectronics fabrication having formed therein a via through a microelectronics layer formed from a material susceptible to sequential etching employing a fluorine containing plasma etch method followed by an oxygen containing plasma etch method, without laterally etching the via.

Second Preferred Embodiment

Figure 8:
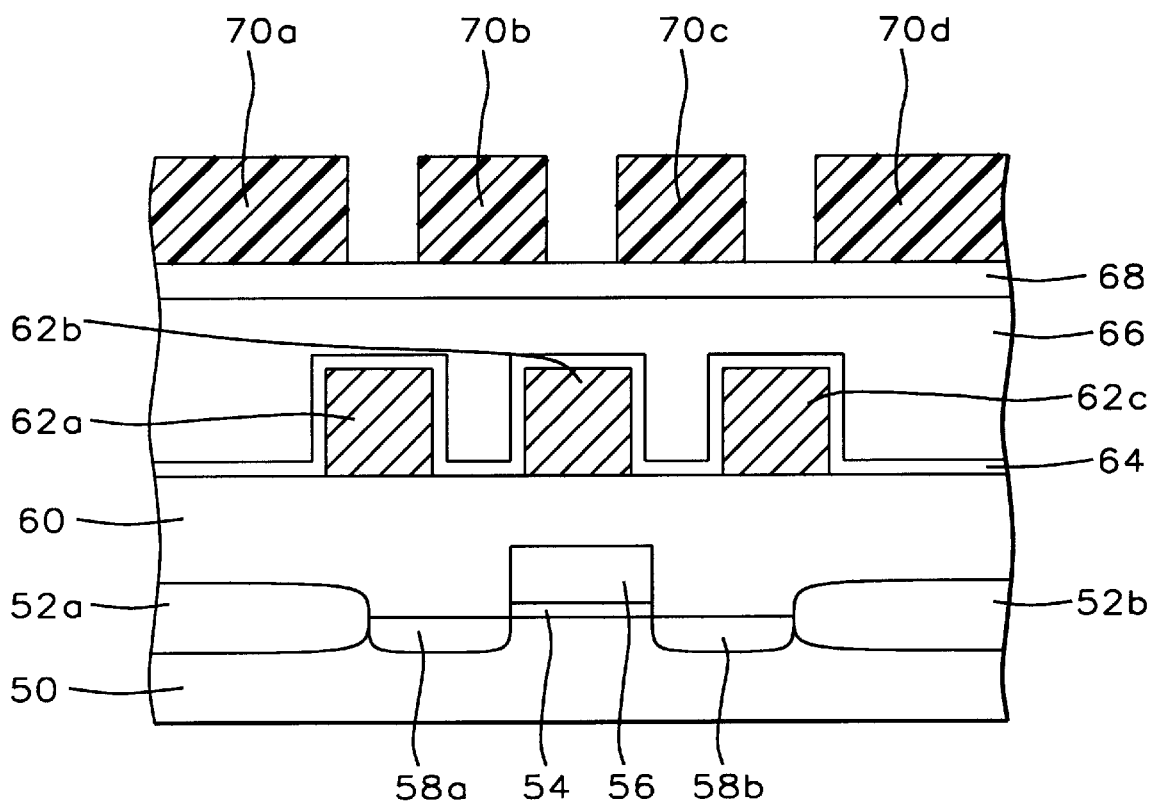
FIG. 8 to FIG. 11 show a series of schematic cross-sectional diagrams illustrating the results of forming within an integrated circuit microelectronics fabrication in accord with a more specific preferred embodiment of the present invention which comprises a second preferred embodiment of the present invention an interconnection via through a sandwich composite low dielectric constant dielectric layer formed employing in-part a silsesquioxane spin-on-glass (SOG) dielectric material, without laterally etching the interconnection via.

Referring now to FIG. 8 to FIG. 11, there is shown a series of schematic crosssectional diagrams illustrating the results of forming within an integrated circuit microelectronics fabrication in accord with a more specific preferred embodiment of the present invention which comprises a second preferred embodiment of the present invention an interconnection via through a sandwich composite low dielectric constant dielectric layer formed employing, in-part, a silsesquioxane spin-on-glass (SOG) dielectric material, without laterally etching the interconnection via. Shown in FIG. 8 is a schematic cross-sectional diagram of the integrated circuit microelectronics fabrication at an early stage in its fabrication.

Shown in FIG. 8 is a semiconductor substrate 50 having formed within and upon its surface a pair of isolation regions 52a and 52b which define an active region of the semiconductor substrate 50 Although it is known in the art of integrated circuit microelectronics fabrication that semiconductor substrates are available with either dopant polarity, various dopant concentrations and several crystallographic orientations, for the second preferred embodiment of the present invention the semiconductor substrate 50 is preferably a (100) silicon semiconductor substrate having an N- or P- doping.

Similarly, although it is also known in the art of integrated circuit microelectronics fabrication that isolation regions may be formed within and/or upon semiconductor substrates to define active regions of those semiconductor substrates through methods including but not limited to isolation region thermal growth methods and isolation region deposition/patterning methods, for the second preferred embodiment of the present invention the isolation regions 52a and 52b are preferably formed within and upon the semiconductor substrate 50 to define the active region of the semiconductor substrate 50 through an isolation region thermal growth method at a temperature of from about 800 to about 1200 degrees centigrade to form the isolation regions 52a and 52b of silicon oxide within and upon the semiconductor substrate 50.

Shown also within FIG. 8 formed within and upon the active region of the semiconductor substrate 50 is a field effect transistor (FET) which comprise a series of structures including: (1) a gate dielectric layer 54 formed upon the active region of the semiconductor substrate 50, the gate dielectric layer 54 having formed and aligned thereupon; (2) a gate electrode 56; and (3) a pair of source/drain regions 58a and 58b formed within the active region of the semiconductor substrate 50 at areas not covered by the gate dielectric layer 54 and the gate electrode 56. Each of the structures within the series of structures which comprises the field effect transistor (FET) may be formed through methods and materials which are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed upon active regions of semiconductor substrates through methods including but not limited to blanket gate dielectric layer thermal growth methods and blanket gate dielectric layer deposition/patterning methods, for the second preferred embodiment of the present invention the gate dielectric layer 54 is preferably formed through patterning, through methods as are conventional in the art, of a blanket gate dielectric layer formed through a blanket gate dielectric layer thermal growth method at a temperature of from about 700 to about 1000 degrees centigrade to form the gate dielectric layer 54 of silicon oxide of thickness about 20 to about 150 angstroms upon the active region of the semiconductor substrate 50.

Similarly, although it is also know in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the gate electrode 56 is preferably formed through patterning, through methods as are conventional in the art, of a blanket layer of a doped polysilicon or polycide gate electrode material formed upon the blanket gate dielectric layer to a thickness of from about 1000 to about 3000 angstroms.

Finally, it is also known in the art of field effect transistor (FET) fabrication that source/drain regions are typically formed into active regions of a semiconductor substrate through ion implantation methods employing dopant ions of polarity opposite the polarity of the semiconductor substrate within which is formed those source/drain regions. For the second preferred embodiment of the present invention, the source/drain regions 58a and 58b are preferably formed within the active region of the semiconductor substrate 50 through a high dose ion implant at an ion implant dose of from about 1E15 to about 5E16 dopant ions per square centimeter and at an ion implantation energy of from about 10 to about 100 keV while employing at least the gate electrode 56 and the gate dielectric layer 54 as an ion implantation mask. The high dose ion implant is of polarity appropriate to the field effect transistor (FET) and the semiconductor substrate 50.

There is also shown within FIG. 8 formed over the semiconductor substrate 50 and the series of structures which forms the field effect transistor (FET) a planarized pre-metal dielectric (PMD) layer 60. Methods and materials through which planarized pre-metal dielectric (PMD) layers may be formed within integrated circuit microelectronics fabrications are known in the art of integrated circuit microelectronics fabrication. Planarized pre-metal dielectric (PMD) layers may be formed within integrated circuit microelectronics fabrications through methods including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 50 is preferably formed of a silicon oxide dielectric material deposited through a plasma enhanced chemical vapor deposition (PECVD) method and subsequently planarized through a chemical mechanical polish (CMP) planarizing method, as is common in the art of integrated circuit microelectronics fabrication. Other methods and materials may, however, also be employed in forming the planarized pre-metal dielectric (PMD) layer 60. Preferably, the planarized pre-metal dielectric (PMD) layer 60 so formed is formed to a thickness of from about 5000 to about 15000 angstroms over the semiconductor substrate 50 and the series of structures which forms the field effect transistor (FET).

Similarly, there is also shown in FIG. 8 formed upon the planarized pre-metal dielectric (PMD) layer 60 a plurality of patterned conductor layers 62a, 62b and 62c. Methods and materials through which patterned conductor layers may be formed within integrated circuit microelectronics fabrications are known in the art of integrated circuit microelectronics fabrication. Patterned conductor layers may be formed within integrated circuit microelectronics fabrications through patterning, through methods as are conventional in the art, of blanket conductor layers formed within integrated circuit microelectronics fabrications. The blanket conductor layers may be formed of conductor materials including but not limited to metals, metal alloys, doped polysilicon and polycides (doped polysilicon/metal silicide stacks). For the second preferred embodiment of the present invention, the plurality of patterned conductor layers 62a, 62b and 62c is preferably formed through patterning, through methods as are conventional in the art, of a blanket conductor layer formed at least in part of an aluminum containing conductor material, although other methods and materials may be employed in forming the plurality of patterned conductor layers 62a, 62b and 62c.

Although not specifically illustrated within the schematic cross-sectional diagram of FIG. 8, each of the patterned conductor layers 62a, 62b or 62c within the plurality of patterned conductor layers 62a, 62b and 62c is preferably formed with: (1) a linewidth of from about 0.1 to about 1.0 microns; (2) an aspect ratio of from about 2:1 to about 5:1; and (3) a separation distance (ie: pitch) from an adjoining patterned conductor layer 62a, 62b or 62c of from about 0.1 to about 1.0 microns.

Shown also within FIG. 8 formed conformally upon the exposed surfaces of the planarized pre-metal dielectric (PMD) layer 60 and the plurality of patterned conductor layers 62a, 62b and 62c is a blanket conformal inter-metal dielectric (IMD) lower liner layer 64. Methods and materials through which conformal inter-metal dielectric liner layers may be formed within integrated circuit microelectronics fabrication are known in the art of integrated circuit microelectronics fabrication. Conformal inter-metal dielectric (IMD) liner layers may be formed within integrated circuit microelectronics fabrications through methods and materials analogous to the methods and materials through which may be formed planarized pre-metal dielectric (PMD) layers within integrated circuit microelectronics fabrications, within the exception that conformal inter-metal dielectric (IMD) liner layers within integrated circuit microelectronics fabrications are not planarized. Thus, for the second preferred embodiment of the present invention, the blanket conformal inter-metal dielectric (IMD) lower liner layer 64 is preferably formed through methods and materials analogous or equivalent to the methods and materials through which is formed the planarized pre-metal dielectric (PMD) layer 60, with the exception that the blanket conformal inter-metal dielectric (IMD) lower liner layer 64 is not planarized. More preferably, the blanket conformal inter-metal dielectric (IMD) lower liner layer 64 so formed is formed to a thickness of from about 500 to about 1000 angstroms from a silicon oxide dielectric material deposited through a plasma enhanced chemical vapor deposition (PECVD) method.

There is also shown in FIG. 8 formed upon the blanket conformal inter-metal dielectric lower liner layer 64 a blanket gap filling inter-metal dielectric (IMD) layer 66. Within the second preferred embodiment of the present invention, the blanket gap filling inter-metal dielectric (IMD) layer 66 is a blanket low dielectric constant dielectric layer preferably formed of a silsesquioxane spin-on-glass (SOG) dielectric material. Thus, the blanket gap filling inter-metal dielectric (IMD) layer 66 within the second preferred embodiment of the present invention is preferably formed through methods and materials analogous or equivalent to the methods and materials employed in forming the blanket microelectronics layer 32 within the first preferred embodiment of the present invention as illustrated in FIG. 4, when the blanket microelectronics layer 32 so formed is formed of a silsesquioxane spin-on-glass (SOG) dielectric material. Preferably, the blanket gap filling inter-metal dielectric (IMD) layer 66 so formed is formed to a thickness of from about 5000 to about 15000 angstroms.

There is also shown in FIG. 8 formed upon the blanket gap filling inter-metal dielectric (IMD) layer 66 a blanket conformal inter-metal dielectric (IMD) upper capping layer 68. Within the second preferred embodiment of the present invention, the blanket conformal inter-metal dielectric upper capping layer 68 is preferably formed through methods and materials analogous or equivalent to the methods and materials employed in forming the blanket conformal inter-metal dielectric (IMD) lower liner layer 64. Preferably, the blanket conformal inter-metal dielectric (IMD) upper capping layer 68 so formed is formed to a thickness of from about 5000 to bout 15000 angstroms.

Finally, there is shown in FIG. 8 a series of patterned photoresist layers 70a, 70b, 70c and 70d formed upon the blanket conformal inter-metal dielectric (IMD) upper capping layer 68. Within the second preferred embodiment of the present invention, the series of patterned photoresist layers 70a, 70b, 70c and 70d is preferably formed through methods and materials, and to dimensions, analogous or equivalent to the methods, materials and dimensions employed in forming the pair of patterned photoresist layers 34a and 34b within the first preferred embodiment of the present invention within the microelectronics fabrication whose schematic cross-sectional diagram is illustrated in FIG. 4.

Figure 9:
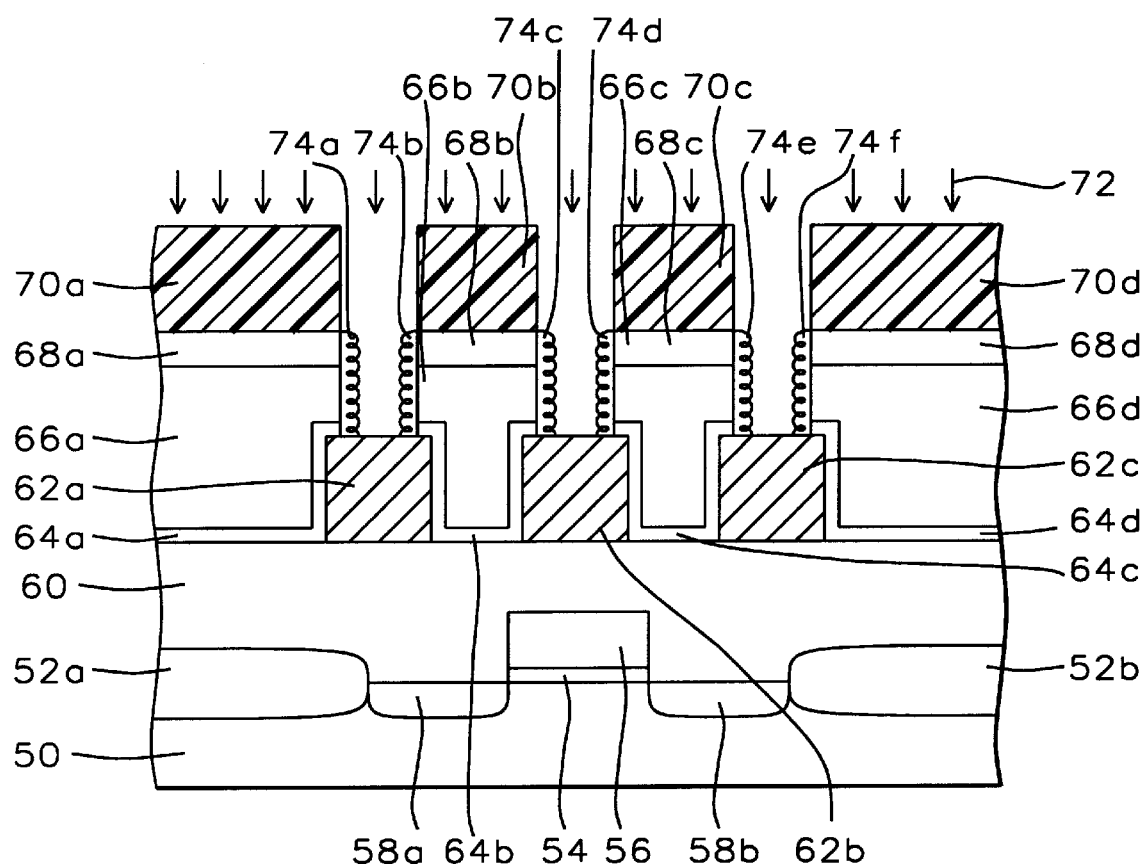

Referring now to FIG. 9, there is shown a schematic cross-sectional diagram illustrating the results of further processing of the integrated circuit microelectronics fabrication whose schematic cross-sectional diagram is illustrated in FIG. 8. Shown in FIG. 9 is a schematic cross-sectional diagram of an integrated circuit microelectronics fabrication otherwise equivalent to the integrated circuit microelectronics fabrication whose schematic cross-sectional diagram is illustrated in FIG. 8, but wherein the blanket conformal inter-metal dielectric (IMD) upper capping layer 68, the blanket gap filling inter-metal dielectric layer 66 and the blanket conformal inter-metal dielectric (IMD) lower liner layer 64 have been patterned to form the corresponding patterned conformal inter-metal dielectric (IMD) upper capping layers 68a, 68b, 68c and 68d, the corresponding patterned gap filling inter-metal dielectric (IMD) layers 66a, 66b, 66c and 66d, and the corresponding patterned conformal inter-metal dielectric (IMD) lower liner layers 64a, 64b, 64c and 64d, while employing the patterned photoresist layers 70a, 70b, 70c and 70d as an etch mask layer, through use of a fluorine containing etching plasma 72 to form a series of interconnection vias which access the patterned conductor layers 62a, 62b and 62c.

Within the second preferred embodiment of the present invention, the fluorine containing etching plasma 72 is preferably formed through methods and materials analogous or equivalent to the methods and materials employed in forming the fluorine containing etching plasma 36 within the first preferred embodiment of the present invention as illustrated in FIG. 5. Thus, similarly with the first preferred embodiment of the present invention, there is formed upon the via sidewalls within the second preferred embodiment of the present invention as illustrated in FIG. 9 a series of fluorocarbon polymer residue layers 74a, 74b, 74c, 74d, 74e and 74f.

Figure 10:
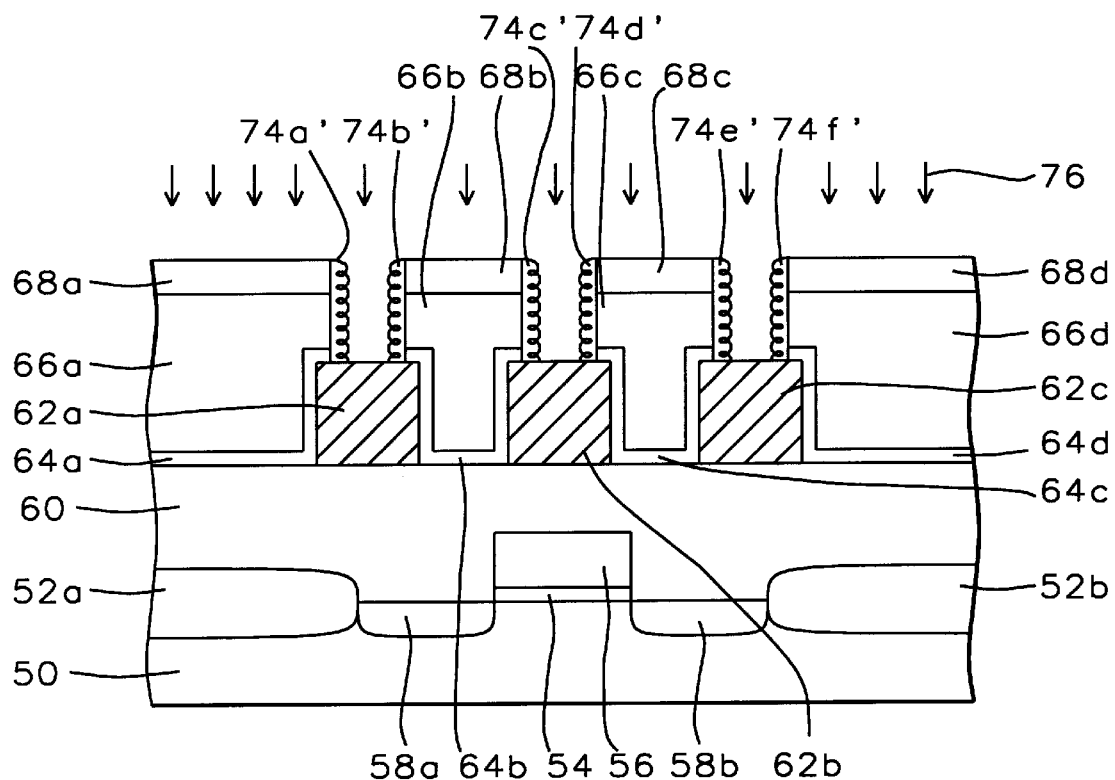

Referring now to FIG. 10, there is shown a schematic cross-sectional diagram illustrating the results of further processing of the integrated circuit microelectronics fabrication whose schematic cross-sectional diagram is illustrated in FIG. 9. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 9, but wherein the patterned photoresist layers 70a, 70b, 70c and 70d have been stripped from the integrated circuit microelectronics fabrication through use of an oxygen containing etching plasma 76. Within the second preferred embodiment of the present invention, the oxygen containing etching plasma 76 as illustrated in FIG. 10 is preferably formed and employed through methods and materials analogous or equivalent to the methods and materials through which the oxygen containing etching plasma 42 within the first preferred embodiment of the present invention as illustrated in FIG. 6 is formed and employed. Also similarly with the first preferred embodiment of the present invention as illustrated within the microelectronics fabrications whose schematic cross-sectional diagrams are illustrated in FIG. 5 and FIG. 6, when stripping from the integrated circuit microelectronics fabrication whose schematic cross-sectional diagram is illustrated in FIG. 9 the patterned photoresist layers 70a, 70b, 70c and 70d to form the integrated circuit microelectronics fabrication whose schematic cross-sectional diagram is illustrated in FIG. 10, the fluorocarbon polymer residue layers 74a, 74b, 74c, 74d, 74e and 74f as illustrated in FIG. 9 are no greater than partially stripped to form the no greater than partially etched fluorocarbon polymer residue layers 74a', 74b', 74c', 74d', 74e' and 74f' as illustrated in FIG. 10.

Figure 11:
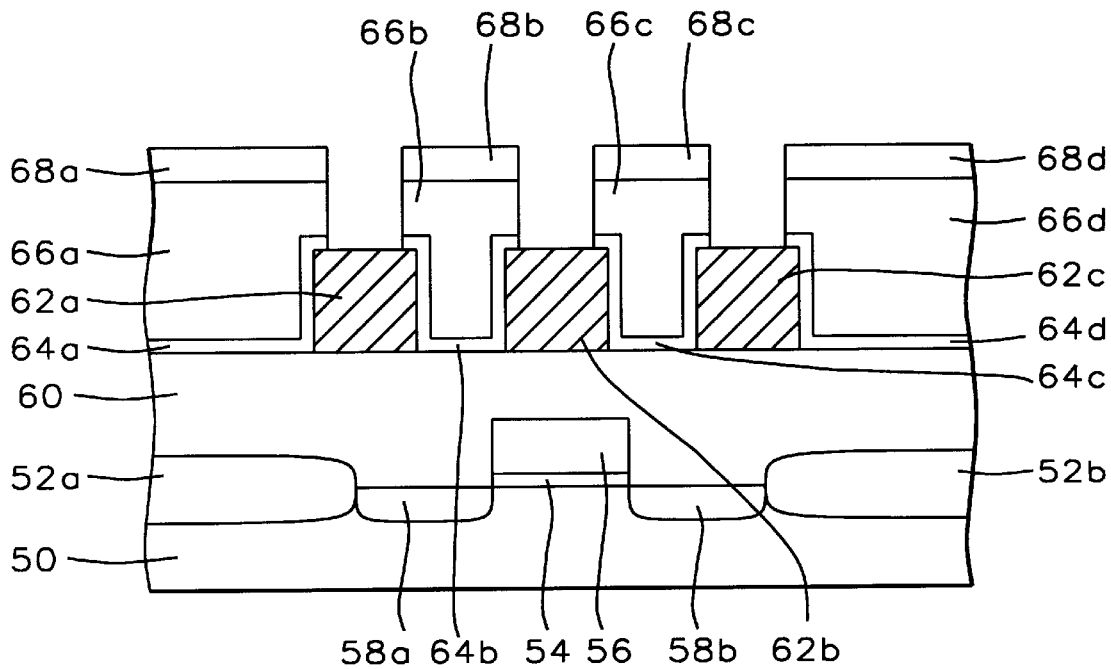

Referring now to FIG. 11, there is shown a schematic cross-sectional diagram illustrating the results of further processing of the integrated circuit microelectronics fabrication whose schematic cross-sectional diagram is illustrated in FIG. 10. Shown in FIG. 11 is a schematic cross-sectional diagram of an integrated circuit microelectronics fabrication otherwise equivalent to the integrated circuit microelectronics fabrication whose schematic cross-sectional diagram is illustrated in FIG. 10, but wherein the no greater than partially stripped fluorocarbon polymer residue layers 74a', 74b', 74c', 74d', 74e' and 74f' are stripped from the via sidewalls within the integrated circuit microelectronics fabrication. Similarly with the first preferred embodiment of the present invention, the no greater than partially stripped fluorocarbon polymer residue layers 74a', 74b', 74c', 74d', 74e' and 74f' as illustrated within the integrated circuit microelectronics fabrication whose schematic cross-sectional diagram is illustrated in FIG. 10 are stripped to form the integrated circuit microelectronics fabrication whose schematic cross-sectional diagram is illustrated in FIG. 11 through a wet chemical stripping method in accord with the wet chemical stripping method as outlined within the first preferred embodiment of the present invention.

Upon forming the integrated circuit microelectronics fabrication whose schematic cross-sectional diagram is illustrated in FIG. 11, there is formed an integrated circuit microelectronics fabrication having formed therein a series of interconnection vias through an inter-metal dielectric (IMD) layer formed in part of a silsesquioxane spin-on-glass (SOG) dielectric material, where when stripping from the integrated circuit microelectronics fabrication a patterned photoresist layer employed in defining the locations of the vias and a series of fluorocarbon polymer residue layers from the via sidewalls there is avoided lateral etching of the vias.

Thus, the integrated circuit microelectronics fabrication whose schematic cross-sectional diagram is illustrated in FIG. 11 may have formed within the series of vias accessing the patterned conductor layers 62a, 62b and 62c a series of conductive interconnection stud layers with attenuated void formation within the conductive interconnection stud layers.

As is understood by a person skilled in the art, while the second preferred embodiment of the present invention illustrates the method of the present invention employed in forming a series of vias through a first inter-metal dielectric (IMD) layer within an integrated circuit microelectronics fabrication, the method of the present invention may also be employed in forming contact vias through pre-metal dielectric (PMD) layers within integrated circuit microelectronics fabrications, as well as interconnection vias through upper lying inter-metal dielectric (IMD) layers and passivation layers within integrated circuits. Typically and preferably, the second preferred embodiment of the present invention is employed in forming interconnection vias through inter-metal dielectric (IMD) layers within integrated circuit microelectronics fabrications since it is typically most desirable to form within integrated circuit microelectronics fabrications inter-metal dielectric (IMD) layers from low dielectric constant dielectric layers formed from silsesquioxane spin-on-glass (SOG) dielectric materials.

As is understood by a person skilled in the art, the preferred embodiments of the present invention are illustrative of the present invention rather than limiting of the present invention. Revisions and modifications may be made to methods, materials, structures and dimensions through which is provided the preferred embodiments of the present invention while still providing embodiments which are within the spirit and scope of the present invention, as defined by the appended claims.

What is claimed is:

1. A method for forming within a microelectronics fabrication a via through a microelectronics layer formed of a material susceptible to sequential etching employing a fluorine containing plasma etch method followed by an oxygen containing plasma etch method comprising:

providing a substrate employed within a microelectronics fabrication;

forming over the substrate a microelectronics layer formed of a material susceptible to sequential etching employing a fluorine containing plasma etch method followed by an oxygen containing plasma etch method;

forming upon the microelectronics layer a patterned photoresist layer;

etching through use of the fluorine containing plasma etch method while employing the patterned photoresist layer as a photoresist etch mask layer the microelectronics layer to form a patterned microelectronics layer having a via formed through the patterned microelectronics layer, the fluorine containing plasma etch method employing a fluorine containing etchant gas composition which simultaneously forms a fluorocarbon polymer residue layer upon a sidewall of the via;

stripping through use of the oxygen containing plasma etch method the patterned photoresist layer from the patterned microelectronics layer while leaving remaining a no greater than partially etched fluorocarbon polymer residue layer upon the sidewall of the via, where the no greater than partially etched fluorocarbon polymer residue layer inhibits lateral etching of the patterned microelectronics layer; and stripping through use of a wet chemical stripping method the no greater than partially etched fluorocarbon polymer residue layer from the sidewall of the via.

2. The method of claim 1 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

3. The method of claim 1 wherein the microelectronics layer is formed from a material chosen from the group of materials consisting of a carbon material, a sulfur material, a silsesquioxane spin-on-glass (SOG) dielectric material and an incompletely cured silicate spin-on-glass (SOG) dielectric material.

4. The method of claim 3 wherein the silsesquioxane spin-on-glass (SOG) dielectric material is chosen from the group of silsesquioxane spin-on-glass (SOG) dielectric materials consisting of hydrogen silsesquioxane spin-on-glass (SOG) dielectric materials (H-Si(OR)3), methyl silsesquioxane spin-on-glass (SOG) dielectric materials (CH3-Si(OR)3), ethyl silsesquioxane spin-on-glass (SOG) dielectric materials (C2H5-Si(OR)3), other carbon bonded organo functional silsesquioxane spin-on-glass (SOG) dielectric materials and fluorocarbon functional silsesquioxane spin-on-glass (SOG) dielectric materials.

5. The method of claim 1 wherein the fluorine containing plasma etch method employs a fluorine containing etchant gas chosen from the group of fluorine containing etchant gases consisting of perfluorocarbons, hydrofluorocarbons, sulfur hexafluoride and nitrogen trifluoride.

6. The method of claim 1 wherein the fluorine containing plasma etch method is a magnetically enhanced reactive ion etch (MERIE) method.

7. The method of claim 1 wherein the oxygen containing plasma etch method employs an oxygen containing etching gas chosen from the group of oxygen containing etching gases consisting of oxygen, ozone, nitrous oxide and nitric oxide.

8. The method of claim 1 wherein the oxygen containing plasma etch method employs a reactor chamber pressure of from about 1 to about 100 mtorr.

9. The method of claim 1 wherein the wet chemical stripping method employs a wet chemical stripper chosen from the group of wet chemical strippers consisting of acetone, N-methylpyrrolidone, tetrahydrofuran, ethanolamine and aqueous solutions thereof.

10. A method for forming within an integrated circuit microelectronics fabrication a via through a dielectric layer formed of a material susceptible to sequential etching employing a fluorine containing plasma etch method followed by an oxygen containing plasma etch method comprising:

providing a semiconductor substrate;

forming over the semiconductor substrate a dielectric layer formed of a material susceptible to sequential etching employing a fluorine containing plasma etch method followed by an oxygen containing plasma etch method;

forming upon the dielectric layer a patterned photoresist layer;

etching through use of the fluorine containing plasma etch method while employing the patterned photoresist layer as a photoresist etch mask layer the dielectric layer to form a patterned dielectric layer having a via formed through the patterned dielectric layer, the fluorine containing plasma etch method employing a fluorine containing etchant gas composition which simultaneously forms a fluorocarbon polymer residue layer upon a sidewall of the via;

stripping through use of the oxygen containing plasma etch method the patterned photoresist layer from the patterned dielectric layer while leaving remaining a no greater than partially etched fluorocarbon polymer residue layer upon the sidewall of the via, where the no greater than partially etched fluorocarbon polymer residue layer inhibits lateral etching of the patterned dielectric layer; and stripping through use of a wet chemical stripping method the no greater than partially etched fluorocarbon polymer residue layer from the sidewall of the via.

11. The method of claim 10 wherein the dielectric layer is formed from a dielectric material chosen from the group of dielectric materials consisting of an amorphous carbon dielectric material, a silsesquioxane spin-on-glass (SOG) dielectric material and an incompletely cured silicate spin-on-glass (SOG) dielectric material.

12. The method of claim 11 wherein the silsesquioxane spin-on-glass (SOG) dielectric material is chosen from the group of silsesquioxane spin-on-glass (SOG) dielectric materials consisting of hydrogen silsesquioxane spin-on-glass (SOG) dielectric materials (H-Si(OR)3), methyl silsesquioxane spin-on-glass (SOG) dielectric materials (CH3-Si(OR)3), ethyl silsesquioxane spin-on-glass (SOG) dielectric materials (C2H5-Si(OR)3), other carbon bonded organo functional silsesquioxane spin-on-glass (SOG) dielectric materials and fluorocarbon functional silsesquioxane spin-on-glass (SOG) dielectric materials.

13. The method of claim 10 wherein the fluorine containing plasma etch method employs a fluorine containing etchant gas chosen from the group of fluorine containing etchant gases consisting of perfluorocarbons, hydrofluorocarbons, sulfur hexafluoride and nitrogen trifluoride.

14. The method of claim 10 wherein the fluorine containing plasma etch method is a magnetically enhanced reactive ion etch (MERIE) method.

15. The method of claim 10 wherein the oxygen containing plasma etch method employs an oxygen containing etching gas chosen from the group of oxygen containing etching gases consisting of oxygen, ozone, nitrous oxide and nitric oxide.

16. The method of claim 10 wherein the oxygen containing plasma etch method employs a reactor chamber pressure of from about 1 to about 100 mtorr.

17. The method of claim 10 wherein the wet chemical stripping method employs a wet chemical stripper chosen from the group of wet chemical strippers consisting of acetone, N-methylpyrrolidone, tetrahydrofuran, ethanolamine and aqueous solutions thereof.

* * * * *